(12) United States Patent
Cheng

(10) Patent No.: US 11,839,072 B2
(45) Date of Patent: Dec. 5, 2023

(54) METHOD FOR PREPARING SEMICONDUCTOR DEVICE WITH T-SHAPED LANDING PAD STRUCTURE

(71) Applicant: NANYA TECHNOLOGY CORPORATION, New Taipei (TW)

(72) Inventor: Min-Chung Cheng, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 91 days.

(21) Appl. No.: 17/716,165

(22) Filed: Apr. 8, 2022

(65) Prior Publication Data

US 2023/0328953 A1 Oct. 12, 2023

(51) Int. Cl.
 *H10B 12/00* (2023.01)
(52) U.S. Cl.
 CPC .................. *H10B 12/0335* (2023.02)
(58) Field of Classification Search
 CPC .......... H01L 23/5283; H01L 23/53257; H10B 12/0335; H10B 12/31
 See application file for complete search history.

(56) References Cited

U.S. PATENT DOCUMENTS

| 2009/0085084 A1* | 4/2009 | Tegen | H01L 21/76808 257/306 |
| 2014/0327063 A1* | 11/2014 | Park | H10B 12/0335 257/296 |
| 2019/0043865 A1* | 2/2019 | Chang | H10B 12/488 |
| 2021/0091073 A1* | 3/2021 | Su | H01L 21/76895 |
| 2021/0091089 A1* | 3/2021 | Ho | H10B 12/485 |
| 2021/0098462 A1* | 4/2021 | Lu | H10B 12/34 |
| 2021/0375877 A1 | 12/2021 | Kim et al. | |

FOREIGN PATENT DOCUMENTS

| CN | 103367317 A | 10/2013 |
| CN | 109509836 A | 3/2019 |
| CN | 109698274 A | 4/2019 |
| TW | 201909387 A | 3/2019 |

OTHER PUBLICATIONS

Taiwanese Office Action dated May 9, 2023 in application No. 111121742, the search report attached to the Office Action; pp. 1-9.

* cited by examiner

*Primary Examiner* — Shahed Ahmed
*Assistant Examiner* — Khatib A Rahman
(74) *Attorney, Agent, or Firm* — MUNCY, GEISSLER, OLDS & LOWE, P.C.

(57) ABSTRACT

A method for preparing a semiconductor device is provided. The method includes forming a first dielectric layer over a semiconductor substrate, and forming a conductive contact penetrating through the first dielectric layer. The method also includes forming a lower landing pad over the conductive contact, and forming a second dielectric layer covering the lower landing pad. The method further includes etching the second dielectric layer to form a first opening exposing the lower landing pad, and forming an upper landing pad in the first opening. The lower landing pad and the upper landing pad form a T-shaped landing pad structure.

12 Claims, 21 Drawing Sheets

METHOD FOR PREPARING SEMICONDUCTOR DEVICE WITH T-SHAPED LANDING PAD STRUCTURE

TECHNICAL FIELD

The present disclosure relates to a method for preparing a semiconductor device, and more particularly, to a method for preparing a semiconductor device with a T-shaped landing pad structure.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as poor electrical interconnection due to misalignment between upper conductive features and lower conductive features. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first dielectric layer disposed over a semiconductor substrate, and a conductive contact penetrating through the first dielectric layer. The semiconductor device also includes a T-shaped landing pad structure disposed over and in direct contact with the conductive contact. The T-shaped landing pad structure includes a lower landing pad and an upper landing pad disposed over the lower landing pad, and a width of the upper landing pad is greater than a width of the lower landing pad. The semiconductor device further includes a capacitor disposed over and in direct contact with the T-shaped landing pad structure, and a second dielectric layer disposed over the first dielectric layer and surrounding the T-shaped landing pad structure and the capacitor.

In an embodiment, the width of the upper landing pad is greater than a width of the capacitor. In an embodiment, a bottom surface of the upper landing pad is in direct contact with the second dielectric layer. In an embodiment, a top surface of the upper landing pad is in direct contact with the second dielectric layer. In an embodiment, the upper landing pad and the lower landing pad include a same material. In an embodiment, the upper landing pad and the lower landing pad include tungsten (W). In an embodiment, the upper landing pad has a protruding portion covering an upper sidewall of the lower landing pad.

In another embodiment of the present disclosure, a method for preparing a semiconductor device is provided. The method includes forming a first dielectric layer over a semiconductor substrate, and forming a conductive contact penetrating through the first dielectric layer. The method also includes forming a lower landing pad over the conductive contact, and forming a second dielectric layer covering the lower landing pad. The method further includes etching the second dielectric layer to form a first opening exposing the lower landing pad, and forming an upper landing pad in the first opening. The lower landing pad and the upper landing pad form a T-shaped landing pad structure.

In an embodiment, a width of the first opening is greater than a width of the lower landing pad. In an embodiment, a top surface of the second dielectric layer is higher than a top surface of the upper landing pad after the T-shaped landing pad structure is formed. In an embodiment, the second dielectric layer is removed after the T-shaped landing pad structure is formed. In an embodiment, the method further includes forming a third dielectric layer covering the T-shaped landing pad structure, etching the third dielectric layer to form a second opening partially exposing the upper landing pad of the T-shaped landing pad structure, and forming a capacitor in the second opening, wherein the capacitor is electrically connected to the conductive contact through the T-shaped landing pad structure. In an embodiment, the first opening includes an extending portion extending into the second dielectric layer to partially expose a sidewall of the lower landing pad. In an embodiment, the forming of the upper landing pad includes filling the extending portion of the first opening with a portion of the upper landing pad.

In yet another embodiment of the present disclosure, a method for preparing a semiconductor device is provided. The method includes forming a first dielectric layer over a semiconductor substrate, and forming a conductive contact penetrating through the first dielectric layer. The method also includes forming a lower landing pad over the conductive contact, and forming a second dielectric layer covering the lower landing pad. The method further includes etching the second dielectric layer to form a first opening exposing a top surface of the lower landing pad, and forming an upper landing pad in the first opening. A width of the upper landing pad is greater than a width of the lower landing pad. In addition, the method includes forming a capacitor over the upper landing pad. The width of the upper landing pad is greater than a width of the capacitor.

In an embodiment, a width of the first opening is greater than the width of the lower landing pad. In an embodiment, the method further includes forming a patterned mask over the second dielectric layer, and etching the second dielectric layer using the patterned mask as a mask to form the first opening. In an embodiment, the method further includes removing the patterned mask and the second dielectric layer after the upper landing pad is formed, and forming a third dielectric layer covering the upper landing pad before the capacitor is formed. In an embodiment, a material of the lower landing pad is the same as a material of the upper landing pad. In an embodiment, a top surface of the lower landing pad is higher than a bottom surface of the first opening before the upper landing pad is formed.

Embodiments of a semiconductor device and method for preparing the same are provided in the disclosure. In some embodiments, the semiconductor device includes a T-shaped landing pad structure disposed over a conductive contact. The T-shaped landing pad structure includes a lower landing pad and an upper landing pad, and a width of the upper landing pad is greater than a width of the lower landing pad. The T-shaped landing pad structure can help to increase landing area for an overlying conductive feature, such as a capacitor, to land on. Therefore, the contact resistance may be reduced, and the misalignment issues between the landing pad structure and the overlying conductive feature may be prevented or reduced. As a result, the overall device performance may be improved, and the yield rate of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
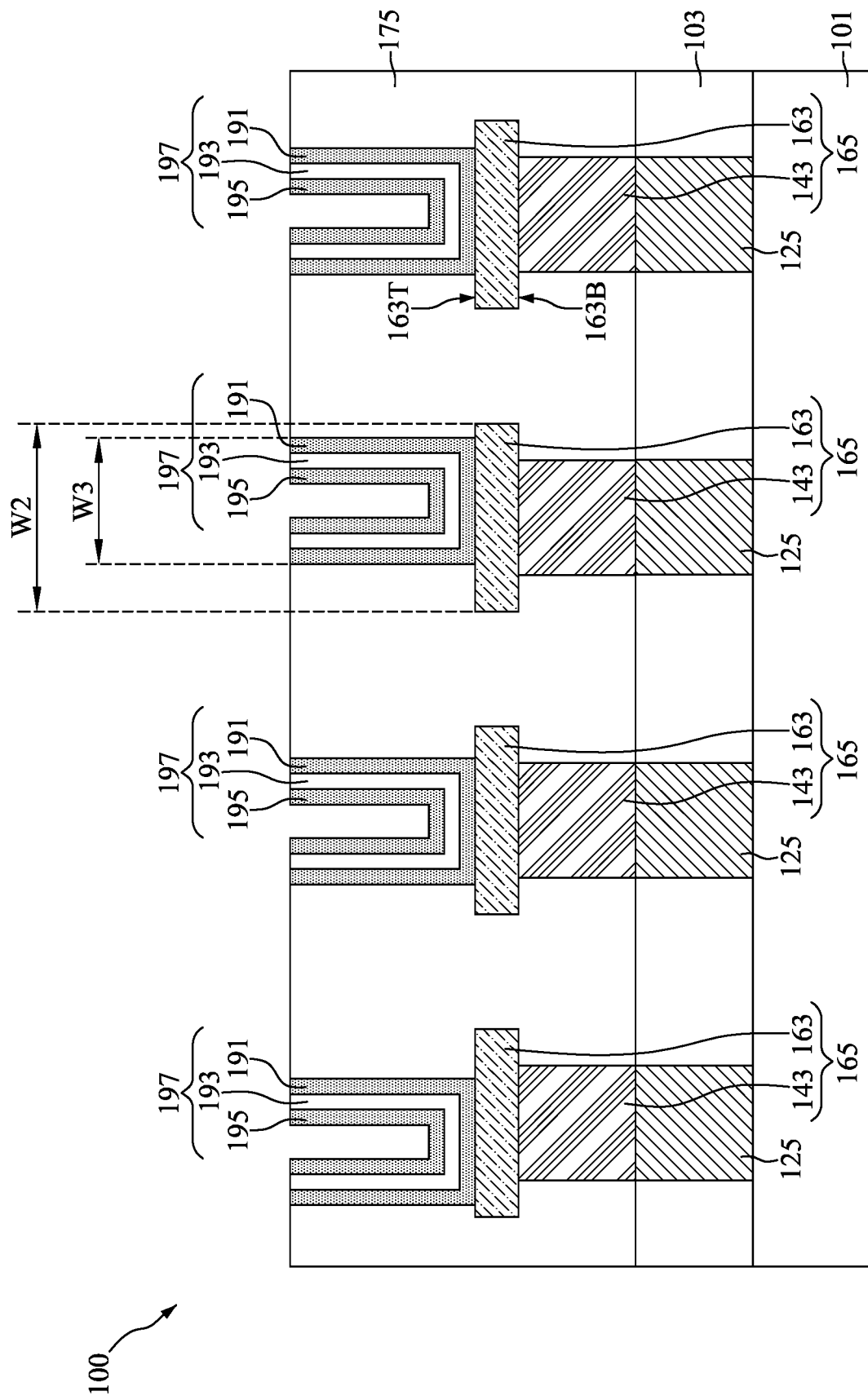
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. In some embodiments, the semiconductor device 100 includes a semiconductor substrate 101, a dielectric layer 103 (also referred to as a first dielectric layer) disposed over the semiconductor substrate 101, a plurality of conductive contacts 125 disposed over the semiconductor substrate 101 and penetrating through the dielectric layer 103. In some embodiments, the semiconductor device 100 includes a dielectric layer 175 (also referred to as a third dielectric layer) disposed over the dielectric layer 103, and a plurality of landing pad structures 165 (also referred to as T-shaped landing pad structures) and a plurality of capacitors 197 disposed in the dielectric layer 175.

In some embodiments, each of the landing pad structures 165 includes a lower landing pad 143 and an upper landing pad 163, which collectively form the landing pad structure 165 with a T-shaped cross-section. In some embodiments, each of the capacitors 197 includes a bottom electrode 191, a top electrode 195, and a dielectric layer 193 sandwiched between the bottom electrode 191 and the top electrode 195. Each of the capacitors 197 is electrically connected to the respective underlying conductive contact 125 through the landing pad structure 165 between them. In some embodiments, the semiconductor device 100 is part of dynamic random access memory (DRAM).

Since the landing pad structures 165 have T-shaped cross-sections, the landing area for the capacitors 197 to land on is increased. Moreover, the contact resistance between the landing pad structures 165 and the capacitors 197 is reduced, and the risk of misalignment between the landing pad structures 165 and the capacitors 197 can be prevented or reduced. As a result, the overall device performance may be improved, and the yield rate of the semiconductor device 100 may be increased.

Figure 2:
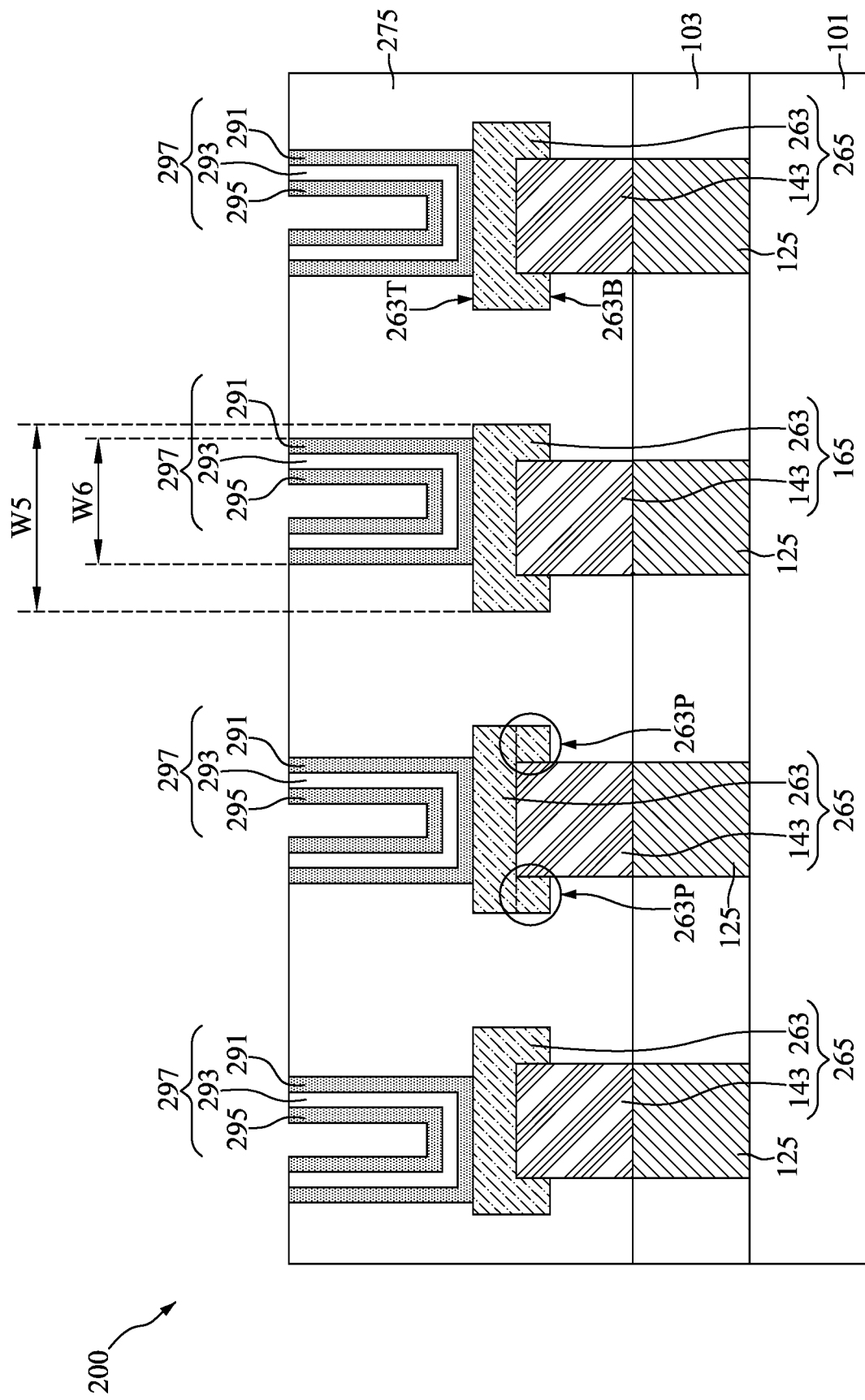
FIG. 2 is a cross-sectional view illustrating a semiconductor device, in accordance with some embodiments.

FIG. 2 is a cross-sectional view illustrating a semiconductor device 200, in accordance with some embodiments. The semiconductor device 200 in FIG. 2 is similar to the semiconductor device 100 in FIG. 1, where same reference numbers refer to the same elements, and certain details or descriptions of the same elements are not repeated. However, in FIG. 2, each of the upper landing pads has protruding portions covering opposite upper sidewalls of the lower landing pads, in accordance with some embodiments.

In some embodiments, the semiconductor device 200 includes a dielectric layer 275 (similar to the dielectric layer 175 in the semiconductor device 100, the dielectric layer 275 is also referred to as a third dielectric layer) disposed over the dielectric layer 103, and a plurality of landing pad structures 265 (similar to the landing pad structure 165 in the semiconductor device 100, the landing pad structures 265 are also referred to as T-shaped landing pad structures) and a plurality of capacitors 297 (similar to the capacitors 197 in the semiconductor device 100) disposed in the dielectric layer 275.

In some embodiments, each of the landing pad structures 265 includes a lower landing pad 143 and an upper landing pad 263, which collectively form the landing pad structure 265 with a T-shaped cross-section. It should be noted that each of the upper landing pads 263 has protruding portions 263P covering opposite upper sidewalls of the respective underlying lower landing pads 143, in accordance with some embodiments. In some embodiments, each of the capacitors 297 includes a bottom electrode 291, a top electrode 295, and a dielectric layer 293 sandwiched between the bottom electrode 291 and the top electrode 295. Each of the capacitors 297 is electrically connected to the respective underlying conductive contact 125 through the landing pad structure 265 between them. In some embodiments, the semiconductor device 200 is part of dynamic random access memory (DRAM).

Since the landing pad structures 265 have T-shaped cross-sections, the landing area for the capacitors 297 to land on is increased. Moreover, the contact resistance between the landing pad structures 265 and the capacitors 297 is reduced, and the risk of misalignment between the landing pad structures 265 and the capacitors 297 can be prevented or reduced. As a result, the overall device performance may be improved, and the yield rate of the semiconductor device 200 may be increased.

Figure 3:
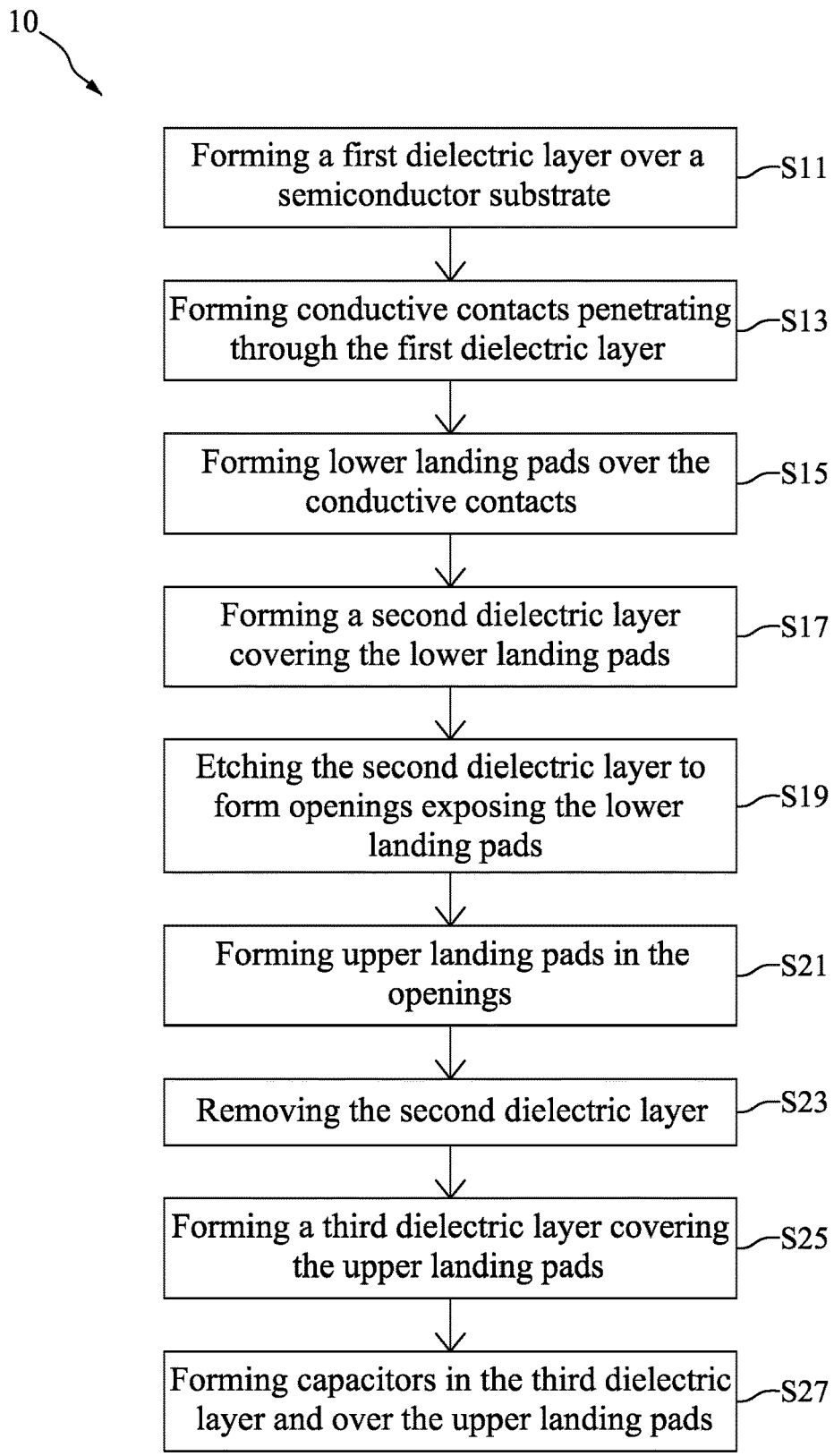
FIG. 3 is a flow diagram illustrating a method for preparing a semiconductor device, in accordance with some embodiments.

FIG. 3 is a flow diagram illustrating a method 10 for preparing a semiconductor device (including the semiconductor devices 100 and the modified semiconductor device 200), and the method 10 includes steps S11, S13, S15, S17, S19, S21, S23, S25 and S27, in accordance with some embodiments. The steps S11 to S27 of FIG. 3 are elaborated in connection with the following figures.

Figure 4:
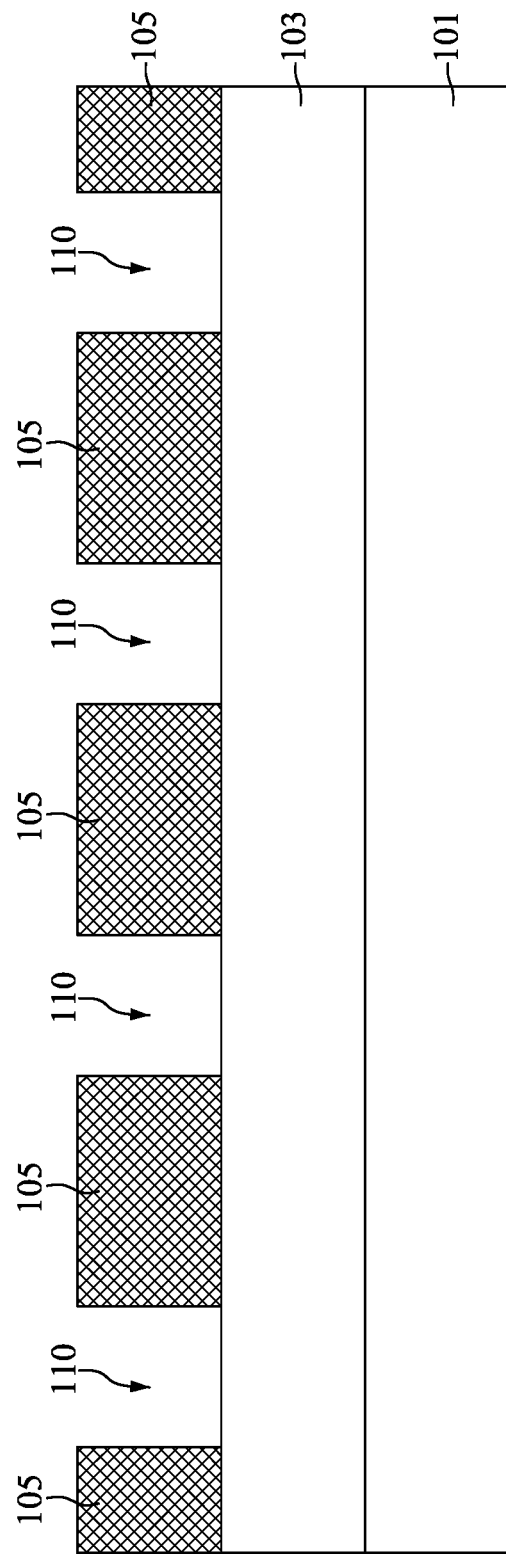
FIG. 4 is a cross-sectional view illustrating an intermediate stage of forming a first dielectric layer over a semiconductor substrate during the formation of the semiconductor device, in accordance with some embodiments.

FIGS. 4-18 are cross-sectional views illustrating intermediate stages in the formation of the semiconductor device 100, in accordance with some embodiments. As shown in FIG. 4, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semi-conductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Moreover, in some embodiments, a plurality of source/drain regions (not shown) are formed in the semiconductor substrate 101.

A dielectric layer 103 is formed over the semiconductor substrate 101, and a patterned mask 105 with a plurality of openings 110 is formed over the dielectric layer 103, as shown in FIG. 4 in accordance with some embodiments. The respective step is illustrated as the step S11 in the method 10 shown in FIG. 3. In some embodiments, the dielectric layer 103 includes a dielectric material, such as silicon oxide, silicon nitride, silicon oxynitride, or another suitable dielectric material. In some embodiments, the dielectric layer 103 is formed by a deposition process, such as a chemical vapor deposition (CVD) process, a physical vapor deposition (PVD) process, an atomic layer deposition (ALD) process, a spin-on coating process, or another suitable method. In some embodiments, the dielectric layer 103 and the patterned mask 105 include different materials so that the etching selectivities may be different in the subsequent etching process.

Next, an etching process is performed on the dielectric layer 103 using the patterned mask 105 as a mask, such that a plurality of openings 120 are formed in the dielectric layer 103, as shown in FIG. in accordance with some embodiments. In some embodiments, the openings 120 penetrate through the dielectric layer 103, such that the semiconductor substrate 101 is exposed by the openings 120. The etching process may be a wet etching process, a dry etching process, or a combination thereof.

Figure 5:
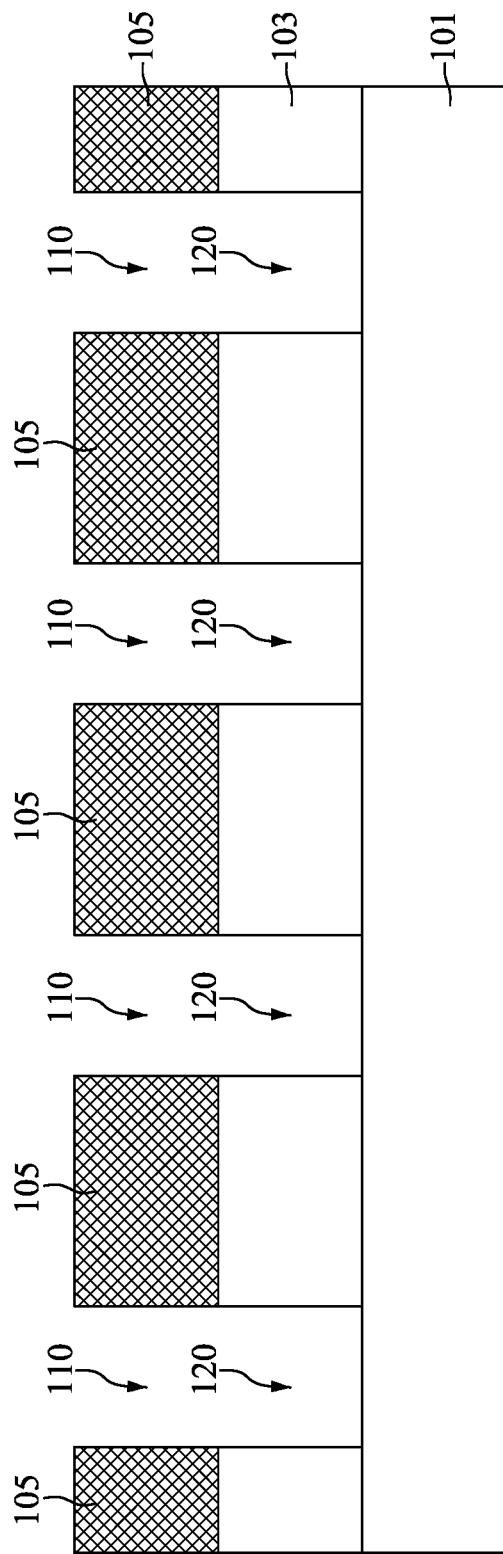
FIG. 5 is a cross-sectional view illustrating an intermediate stage of forming openings in the first dielectric layer during the formation of the semiconductor device, in accordance with some embodiments.
Figure 6:
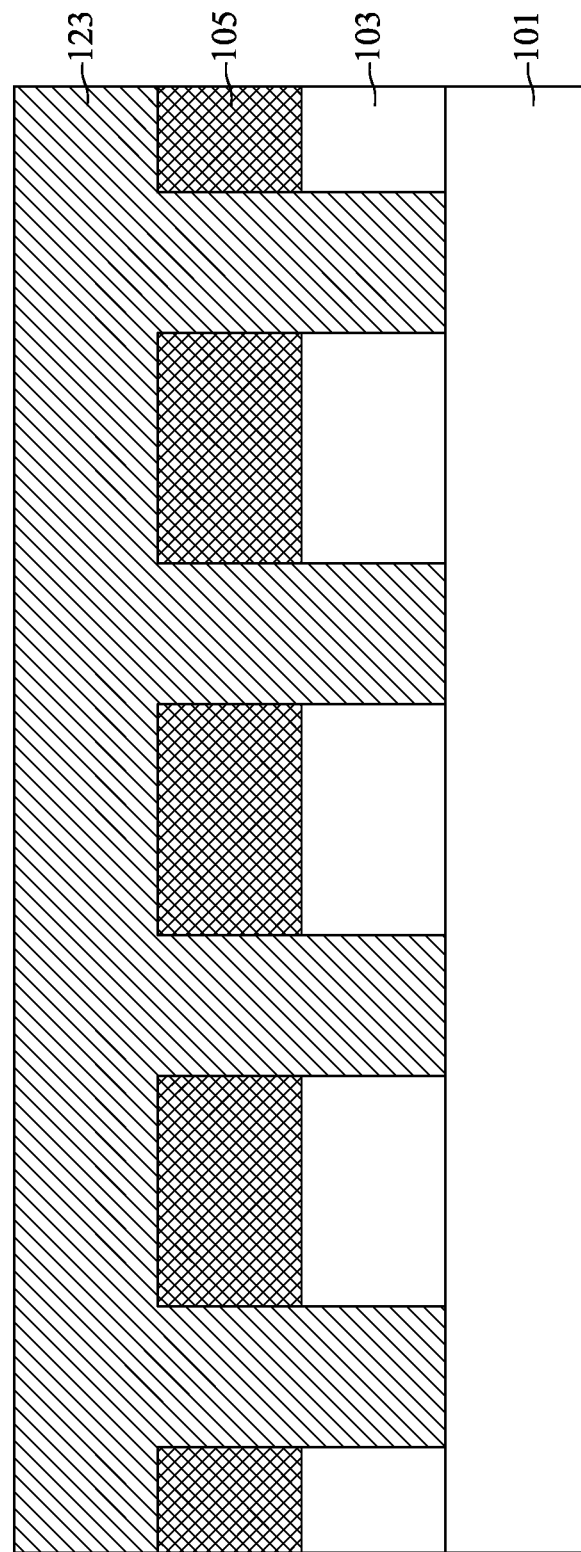
FIG. 6 is a cross-sectional view illustrating an intermediate stage of forming a conductive material in the openings and over the first dielectric layer during the formation of the semiconductor device, in accordance with some embodiments.

Subsequently, a conductive material 123 is formed over the patterned mask 105, as shown in FIG. 6 in accordance with some embodiments. In some embodiments, the openings 110 and 120 shown in FIG. 5 are filled by the conductive material 123. In some embodiments, the conductive material 123 includes copper (Cu), tungsten (W), aluminum (Al), titanium (Ti), tantalum (Ta), gold (Au), silver (Ag), a combination thereof, or another suitable conductive material. The conductive material 123 may be formed by a deposition process, such as a CVD process, a PVD process, an ALD process, a sputtering process, another suitable method, or a combination thereof.

Figure 7:
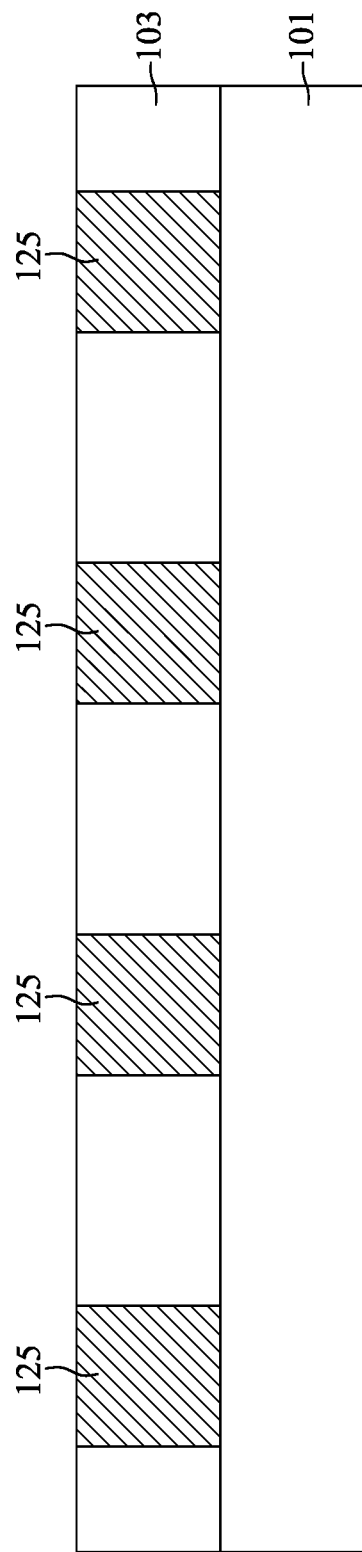
FIG. 7 is a cross-sectional view illustrating an intermediate stage of planarizing the conductive material to form conductive contacts in the first dielectric layer during the formation of the semiconductor device, in accordance with some embodiments.

Then, a planarization process is performed on the conductive material 123, such that a plurality of conductive contacts 125 are formed in the dielectric layer 103, as shown in FIG. 7 in accordance with some embodiments. In some embodiments, each of the conductive contacts 125 penetrates through the dielectric layer 103 to contact and electrically connect with the respective underlying source/drain regions (not shown). The respective step is illustrated as the step S13 in the method 10 shown in FIG. 3.

The planarization process may include a chemical mechanical polishing (CMP) process. After the planarization process, the top surfaces of the conductive contacts 125 are substantially coplanar with the top surface of the dielectric layer 103. Within the context of this disclosure, the word "substantially" means preferably at least 90%, more preferably 95%, even more preferably 98%, and most preferably 99%.

Figure 8:
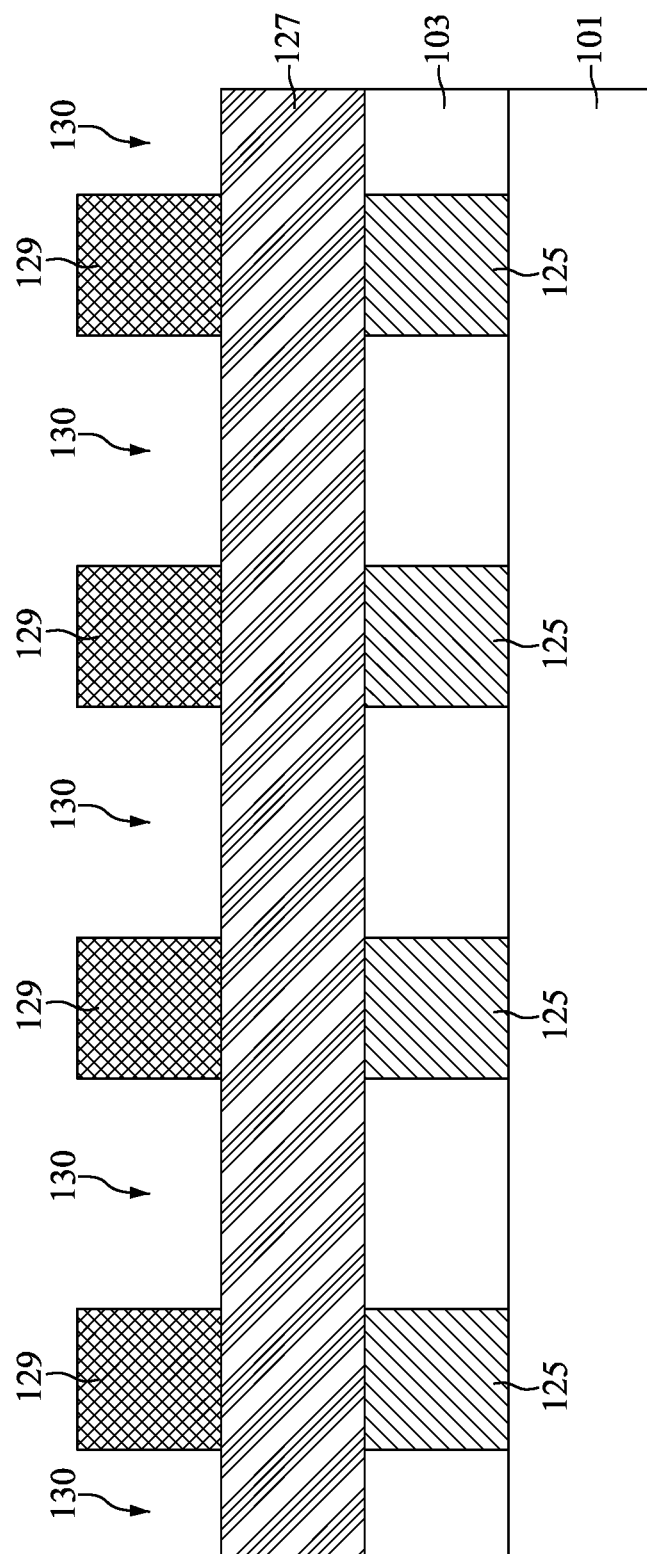
FIG. 8 is a cross-sectional view illustrating an intermediate stage of forming a conductive material covering the first dielectric layer and the conductive contacts during the formation of the semiconductor device, in accordance with some embodiments.

Next, a conductive material 127 is formed covering the dielectric layer 103 and the conductive contacts 125, and a patterned mask 129 with a plurality of openings 130 is formed over the conductive material 127, as shown in FIG. 8 in accordance with some embodiments. In some embodiments, the conductive material 127 includes tungsten (W). However, other suitable conductive materials, such as copper (Cu), aluminum (Al), titanium (Ti), tantalum (Ta), gold (Au), silver (Ag), a combination thereof, may also be used. Some processes used to form the conductive material 127 are similar to, or the same as those used to form the conductive material 123, and details thereof are not repeated herein. In addition, the conductive material 127 and the patterned mask 129 include different materials so that the etching selectivities may be different in the subsequent etching process.

Figure 9:
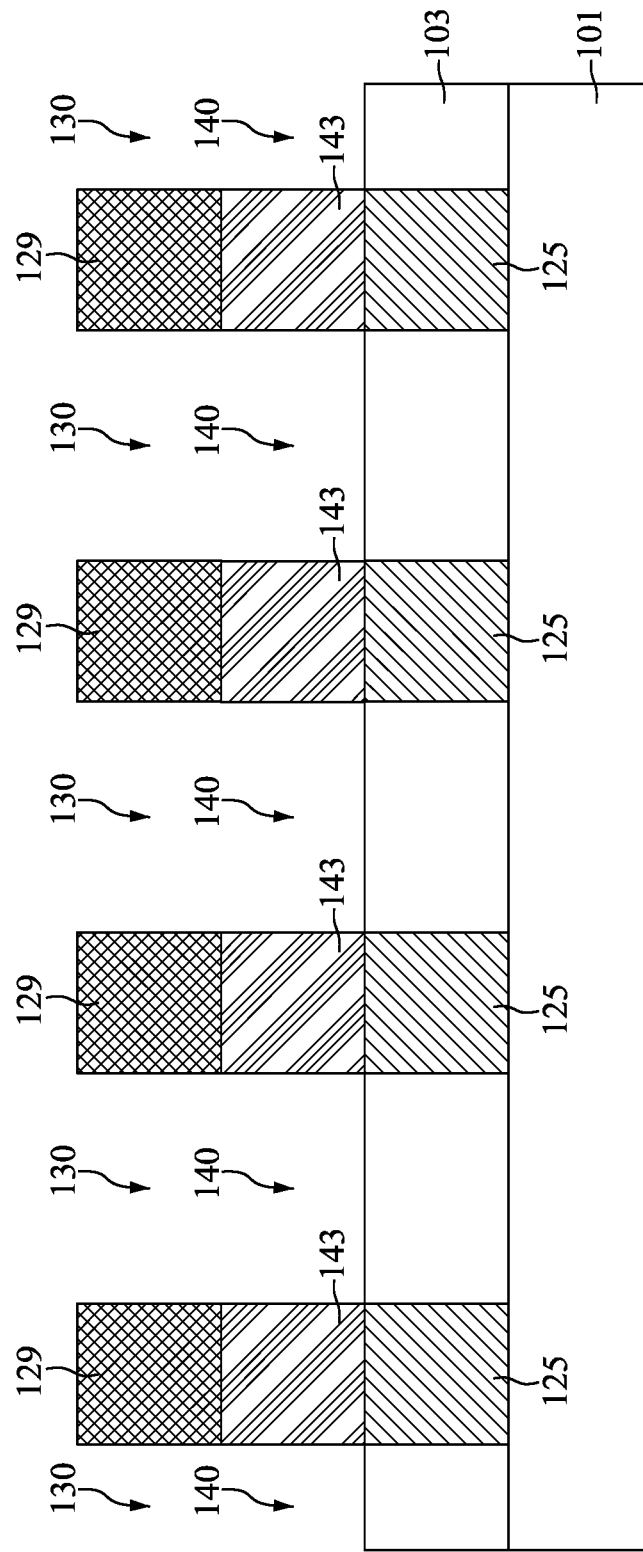
FIG. 9 is a cross-sectional view illustrating an intermediate stage of etching the conductive material to form lower landing pads during the formation of the semiconductor device, in accordance with some embodiments.

Subsequently, an etching process is performed on the conductive material 127 using the patterned mask 129 as a mask, such that a plurality of lower landing pads 143 over the conductive contacts 125 are formed, as shown in FIG. 9 in accordance with some embodiments. The respective step is illustrated as the step S15 in the method 10 shown in FIG. 3. In some embodiments, a plurality of openings 140 between the lower landing pads 143 are formed during the etching process, and the dielectric layer 103 is exposed by the openings 140.

The etching process may be a wet etching process, a dry etching process, or a combination thereof. After the lower landing pads 143 are formed, the patterned mask 129 may be removed. In some embodiments, the patterned mask 129 is removed by a stripping process, an ashing process, an etching process, or another suitable process.

Figure 10:
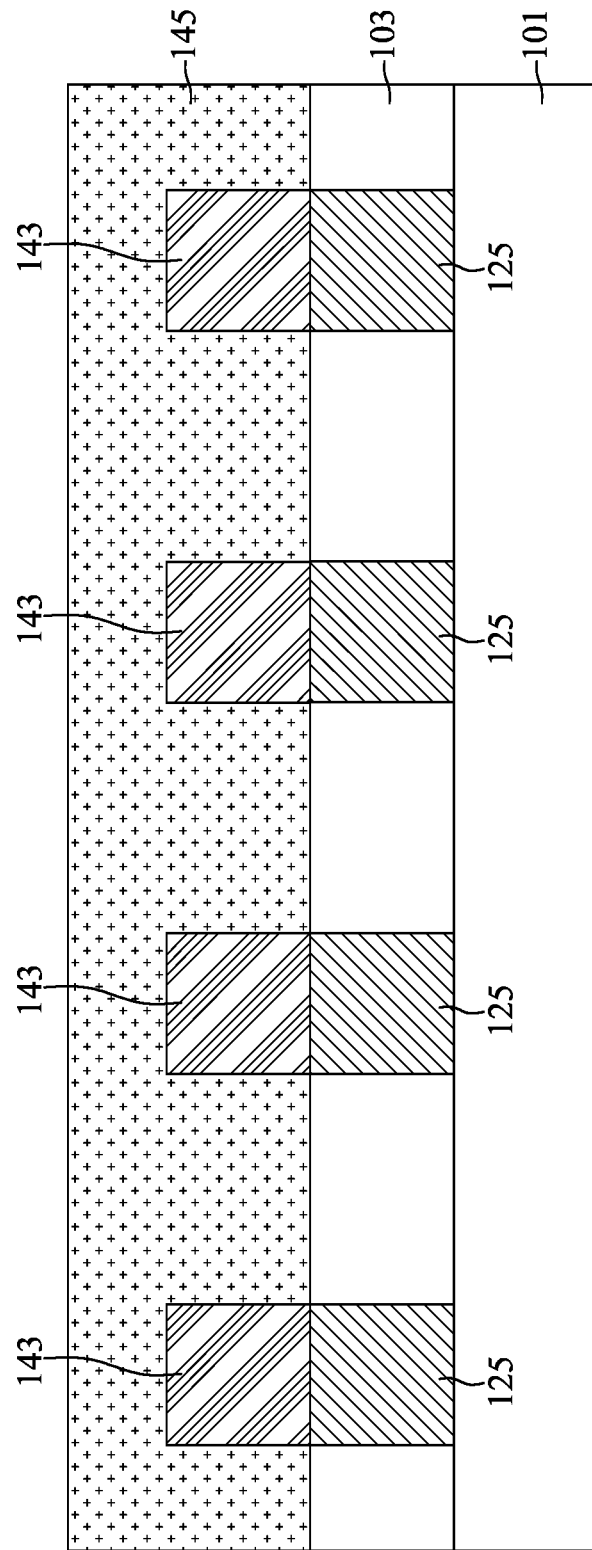
FIG. 10 is a cross-sectional view illustrating an intermediate stage of forming a second dielectric layer covering the lower landing pads during the formation of the semiconductor device, in accordance with some embodiments.

After the removal of the patterned mask 129, a dielectric layer 145 is formed covering the lower landing pads 143 and the dielectric layer 103, as shown in FIG. 10 in accordance with some embodiments. The respective step is illustrated as the step S17 in the method 10 shown in FIG. 3. In some embodiments, the dielectric layer 145 includes a dielectric material, such as silicon oxide. However, other suitable dielectric materials, such as silicon nitride, silicon oxynitride, may also be used. Some processes used to form the dielectric layer 145 are similar to, or the same as those used to form the dielectric layer 103, and details thereof are not repeated herein.

Figure 11:
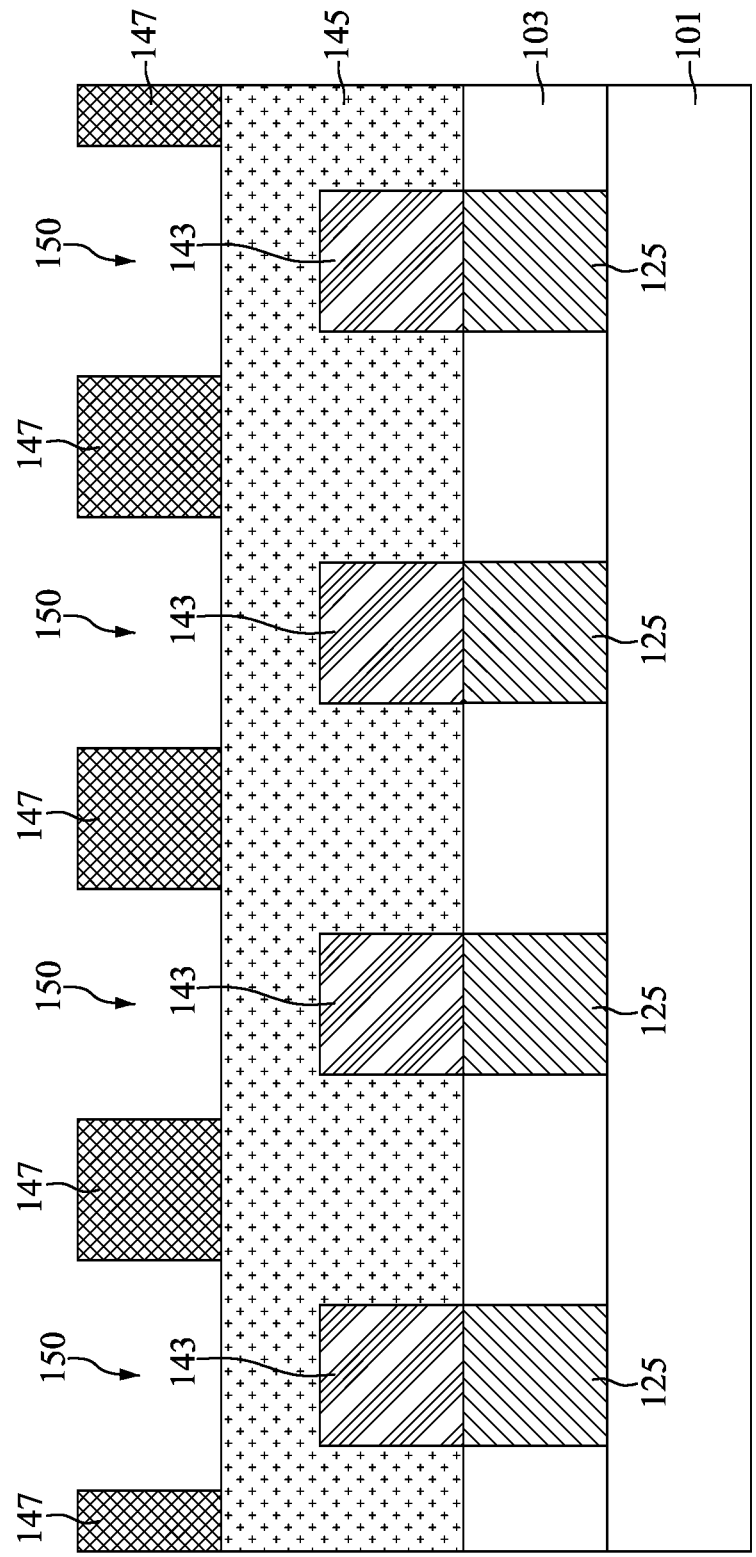
FIG. 11 is a cross-sectional view illustrating an intermediate stage of forming a patterned mask over the second dielectric layer during the formation of the semiconductor device, in accordance with some embodiments.

Then, a patterned mask 147 with a plurality of openings 150 is formed over the dielectric layer 145, as shown in FIG. 11 in accordance with some embodiments. In some embodiments, the patterned mask 147 may be a photoresist patterned by a suitable photolithography process. In some embodiments, the patterned mask 147 and the dielectric layer 145 include different materials so that the etching selectivities may be different in the subsequent etching process.

Figure 12:
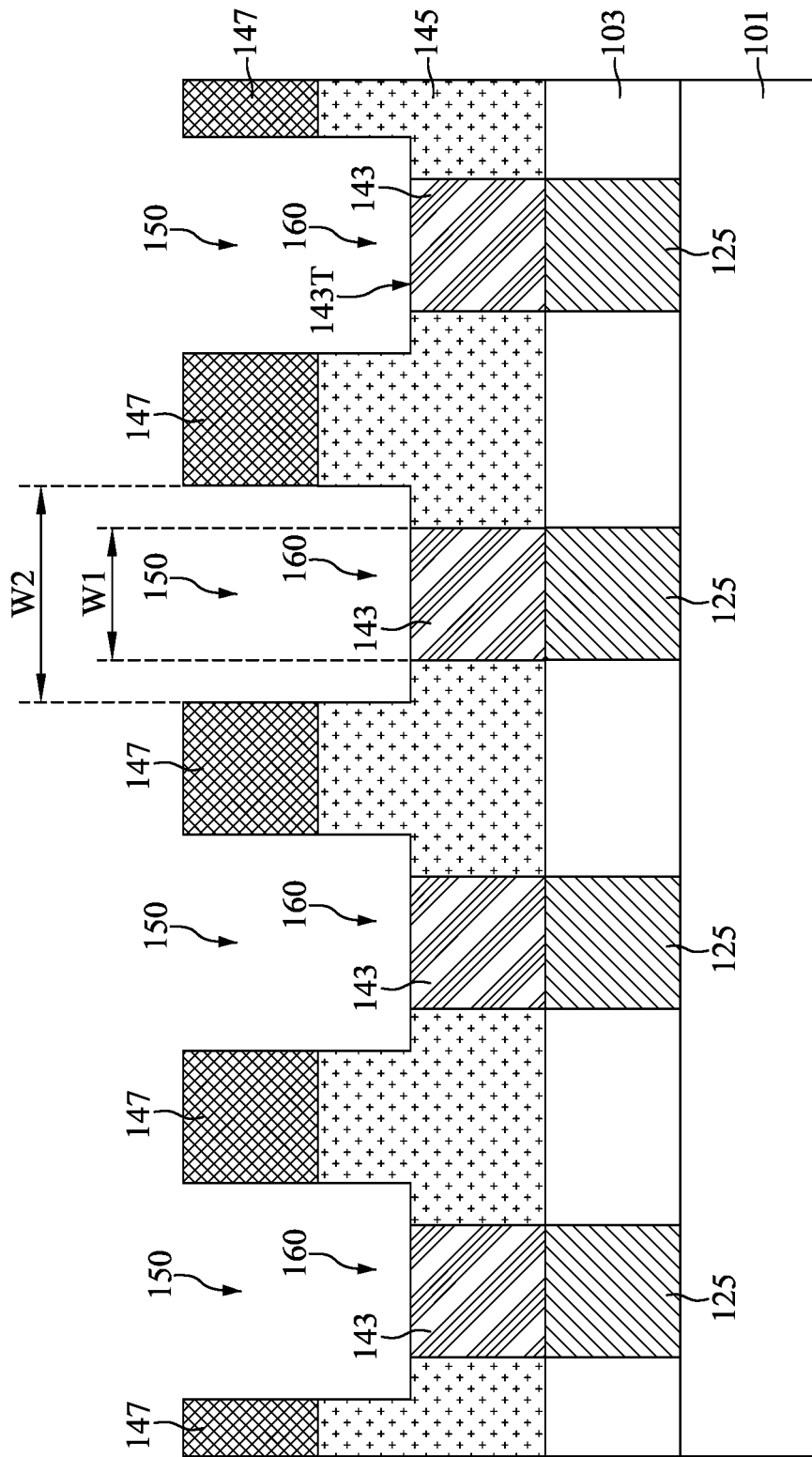
FIG. 12 is a cross-sectional view illustrating an intermediate stage of etching the second dielectric layer to form openings exposing top surfaces of the lower landing pads during the formation of the semiconductor device, in accordance with some embodiments.

Next, an etching process is performed on the dielectric layer 145 using the patterned mask 147 as a mask, such that the top surfaces 143T of the lower landing pads 143 are exposed by a plurality of openings 160, as shown in FIG. 12 in accordance with some embodiments. The respective step is illustrated as the step S19 in the method 10 shown in FIG. 3. In some embodiments, each of the lower landing pads 143 has a width W1, each of the openings 160 has a width W2, and the width W2 is greater than the width W1. The etching process may be a wet etching process, a dry etching process, or a combination thereof.

Figure 13:
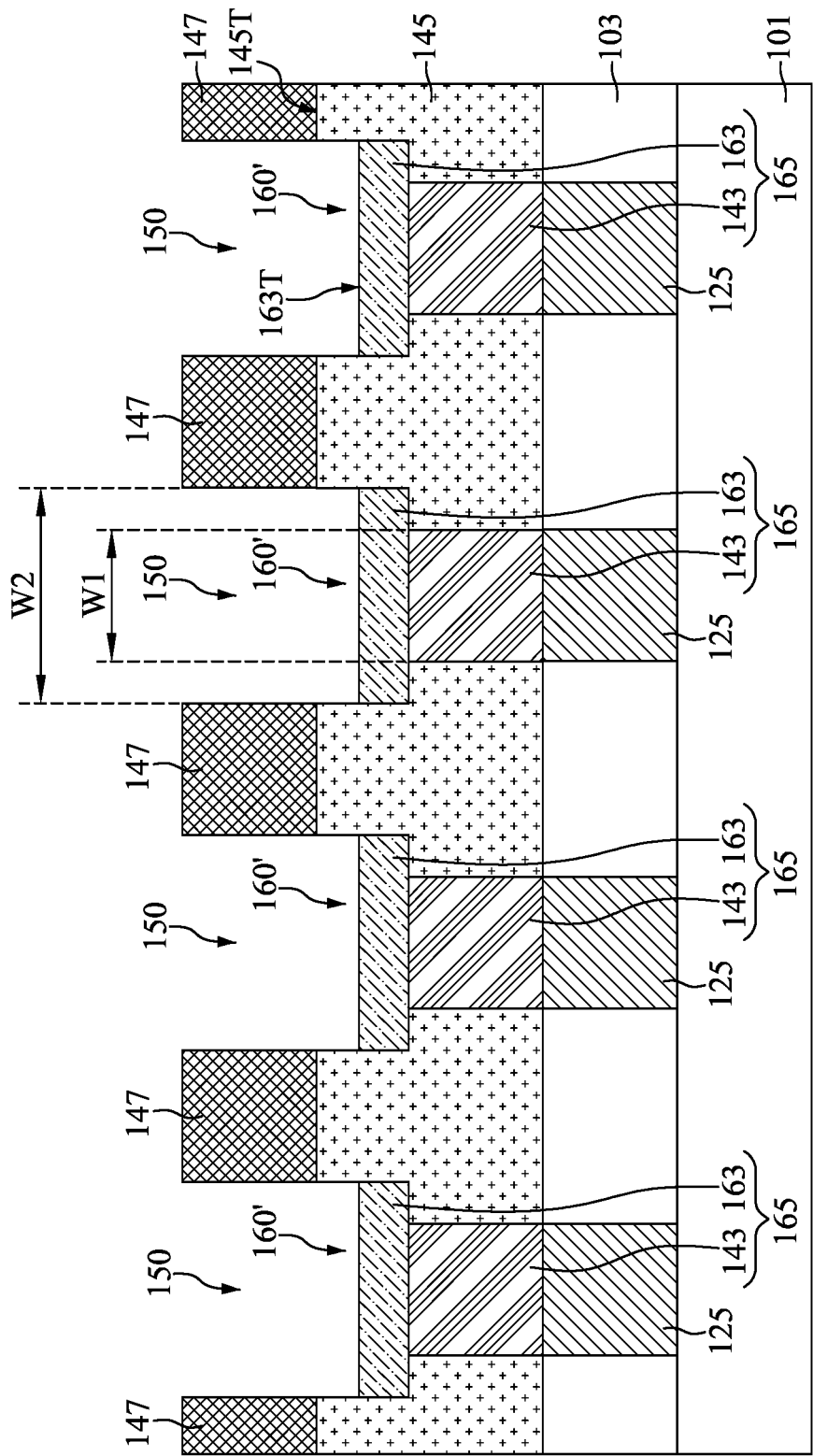
FIG. 13 is a cross-sectional view illustrating an intermediate stage of forming upper landing pads in the openings during the formation of the semiconductor device, in accordance with some embodiments.

Subsequently, a plurality of upper landing pads 163 are formed in the openings 160, as shown in FIG. 13 in accordance with some embodiments. The respective step is illustrated as the step S21 in the method 10 shown in FIG. 3. In some embodiments, the openings 160 are not fully filled with the upper landing pads 163. In other words, the openings 160 partially filled with the upper landing pads 163 become remaining openings 160'. In some embodiments, the top surfaces 163T of the upper landing pads 163 are lower than the top surface 145T of the dielectric layer 145.

Moreover, each of the upper landing pads 163 has a width substantially the same as the width W2 of the openings 160 shown in FIG. 12. As mentioned above, the width W2 of the upper landing pads 163 is greater than the width W1 of the lower landing pads 143. In some embodiments, the upper landing pads 163 include tungsten (W). However, other suitable conductive materials, such as copper (Cu), aluminum (Al), titanium (Ti), tantalum (Ta), gold (Au), silver (Ag), a combination thereof, may also be used. In some embodiments, the upper landing pads 163 and the lower landing pads 143 include the same material, such as tungsten (W). Some processes used to form the upper landing pads 163 are similar to, or the same as those used to form the conductive material 123, and details thereof are not repeated herein. After the upper landing pads 163 are formed, the landing pads structures 165 with T-shaped cross-sections are obtained.

Figure 14:
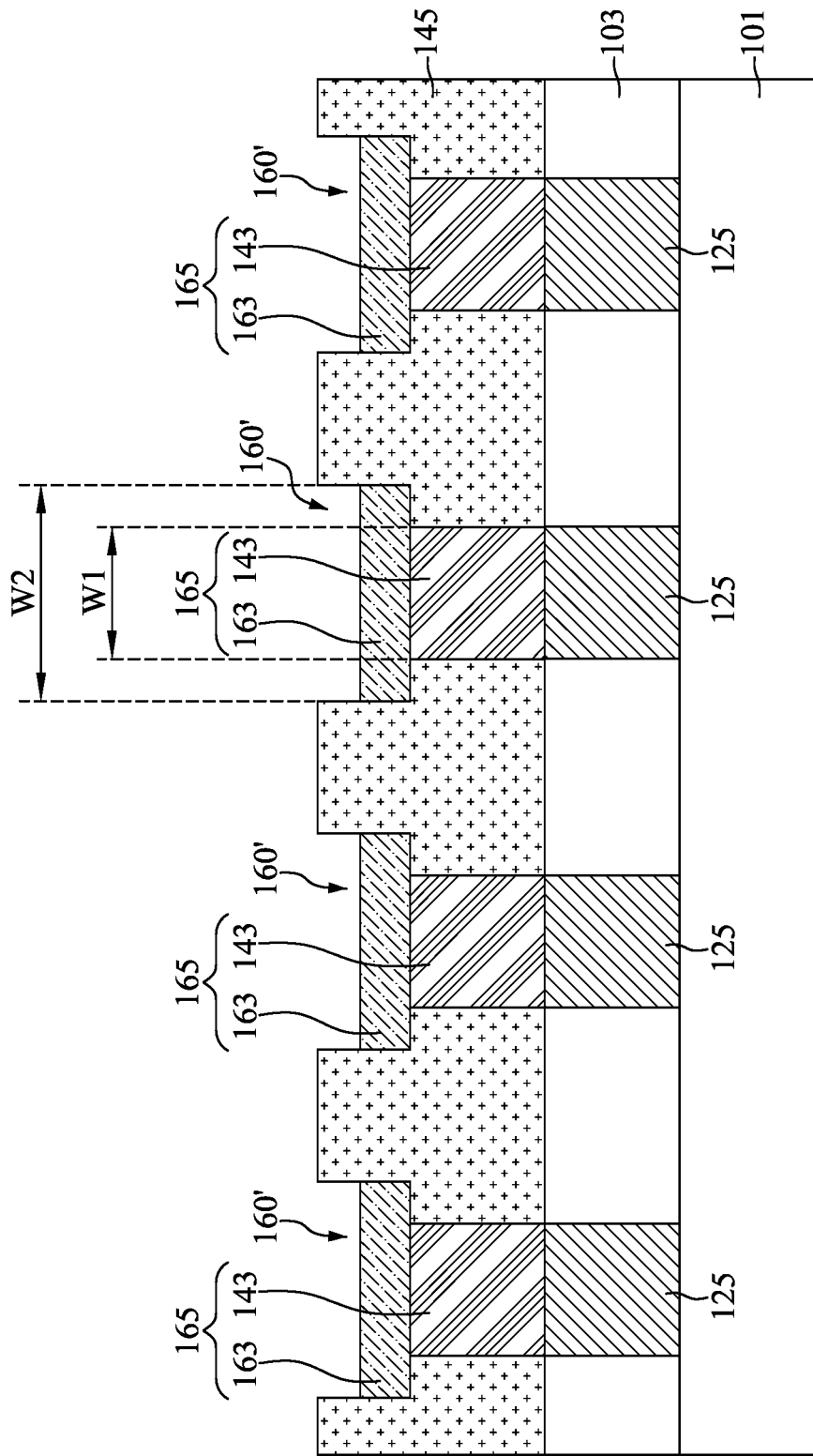
FIG. 14 is a cross-sectional view illustrating an intermediate stage of removing the patterned mask during the formation of the semiconductor device, in accordance with some embodiments.

After the upper landing pads 163 are formed, the patterned mask 147 is removed, as shown in FIG. 14 in accordance with some embodiments. In some embodiments, the patterned mask 147 is removed by a stripping process, an ashing process, an etching process, or another suitable process.

Figure 15:
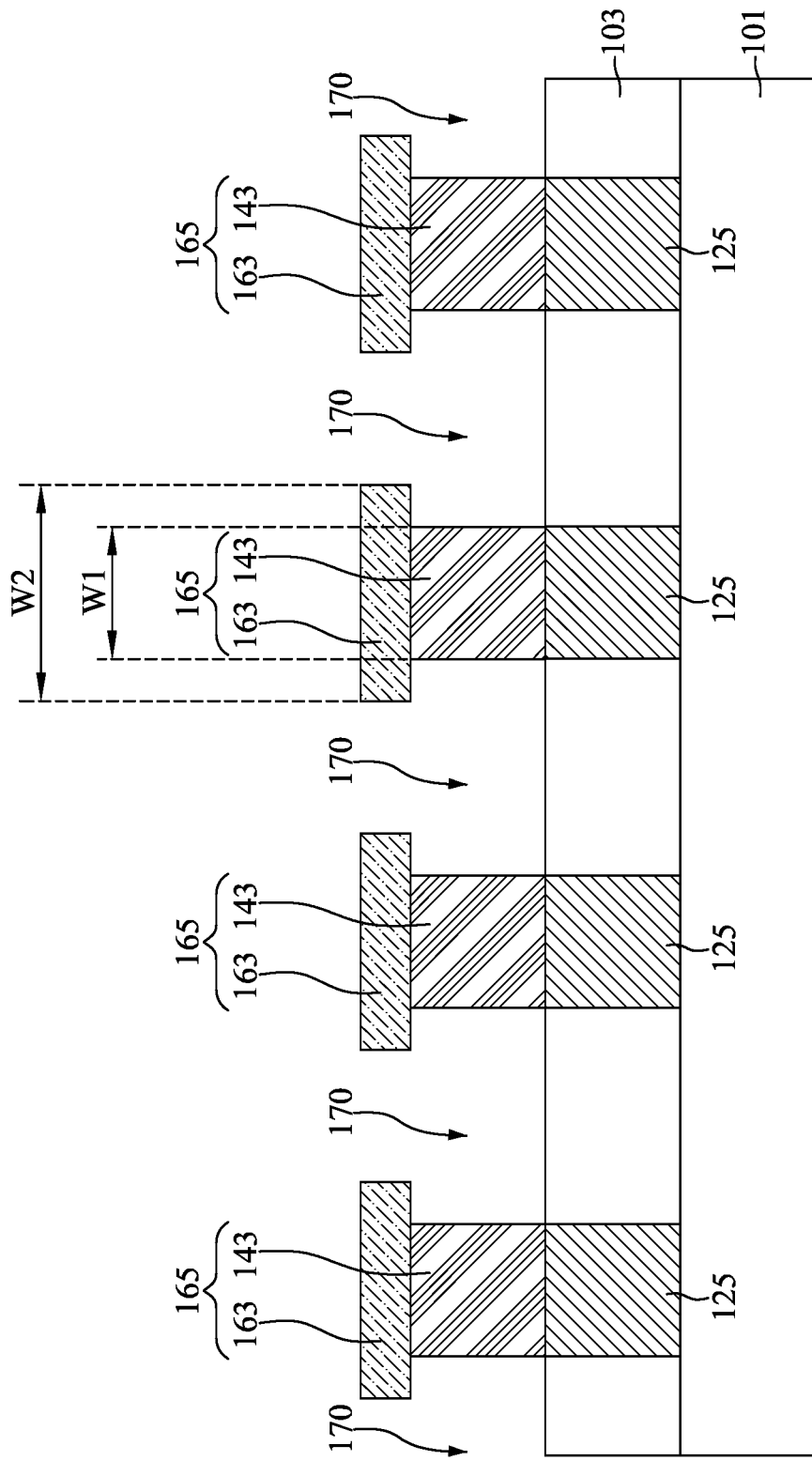
FIG. 15 is a cross-sectional view illustrating an intermediate stage of removing the second dielectric layer during the formation of the semiconductor device, in accordance with some embodiments.

Then, the dielectric layer 145 is removed, as shown in FIG. 15 in accordance with some embodiments. The respective step is illustrated as the step S23 in the method 10 shown in FIG. 3. In some embodiments, the dielectric layer 145 is removed by an etching process. For example, the dielectric layer 145 is removed by a wet etching process. After the removal of the dielectric layer 145, any two adjacent ones of the landing pad structures 165 are separated by an opening 170, in accordance with some embodiments. As shown in FIG. 15, each of the openings 170 has an inverted T-shape.

Figure 16:
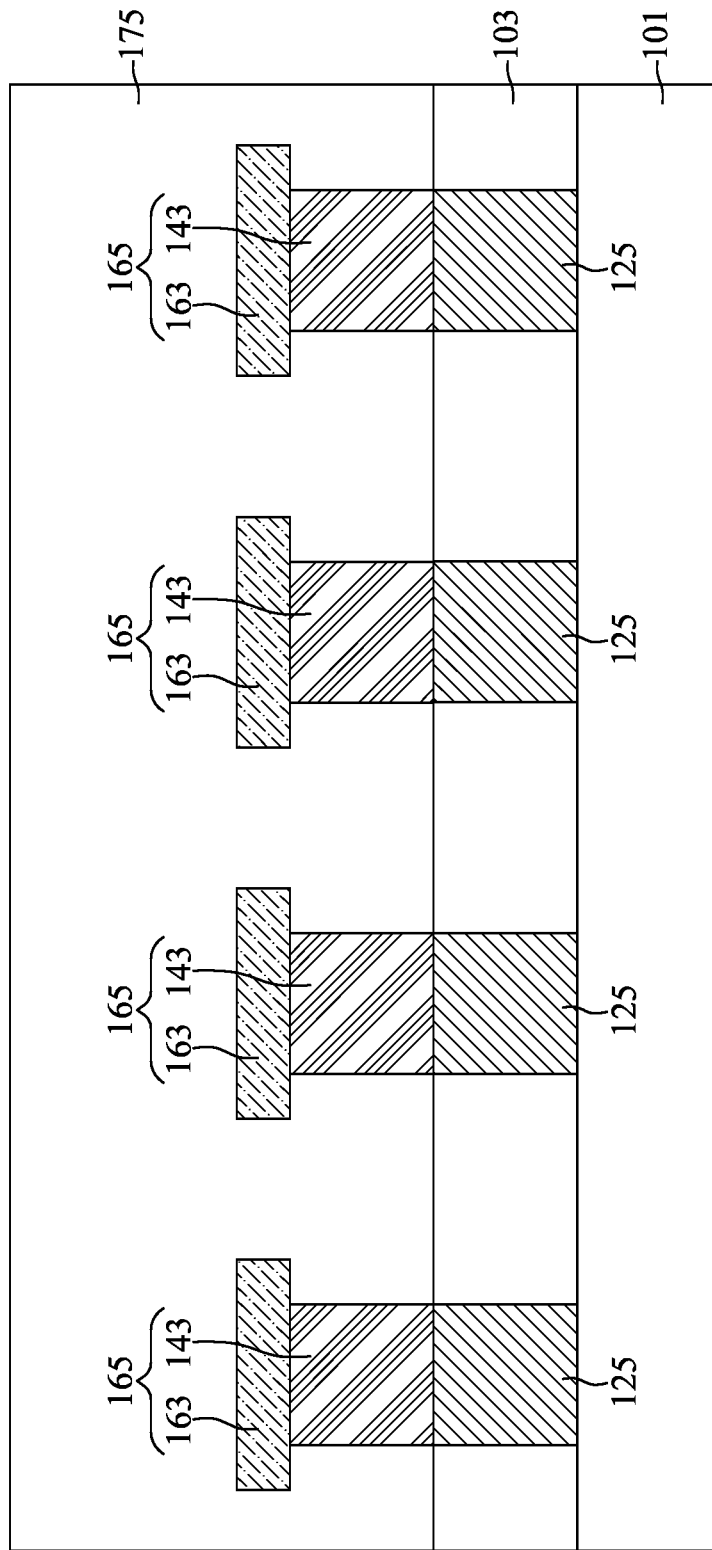
FIG. 16 is a cross-sectional view illustrating an intermediate stage of forming a third dielectric layer covering the upper landing pads during the formation of the semiconductor device, in accordance with some embodiments.

Next, a dielectric layer 175 is formed covering the landing pad structure 165 (including the lower landing pads 143 and the upper landing pads 163) and the dielectric layer 103, as shown in FIG. 16 in accordance with some embodiments. The respective step is illustrated as the step S25 in the method 10 shown in FIG. 3. In some embodiments, the openings 170 with inverted T-shapes as shown in FIG. 15 are filled by the dielectric layer 175. Some materials and processes used to form the dielectric layer 175 are similar to, or the same as those used to form the dielectric layer 103, and details thereof are not repeated herein.

Figure 17:
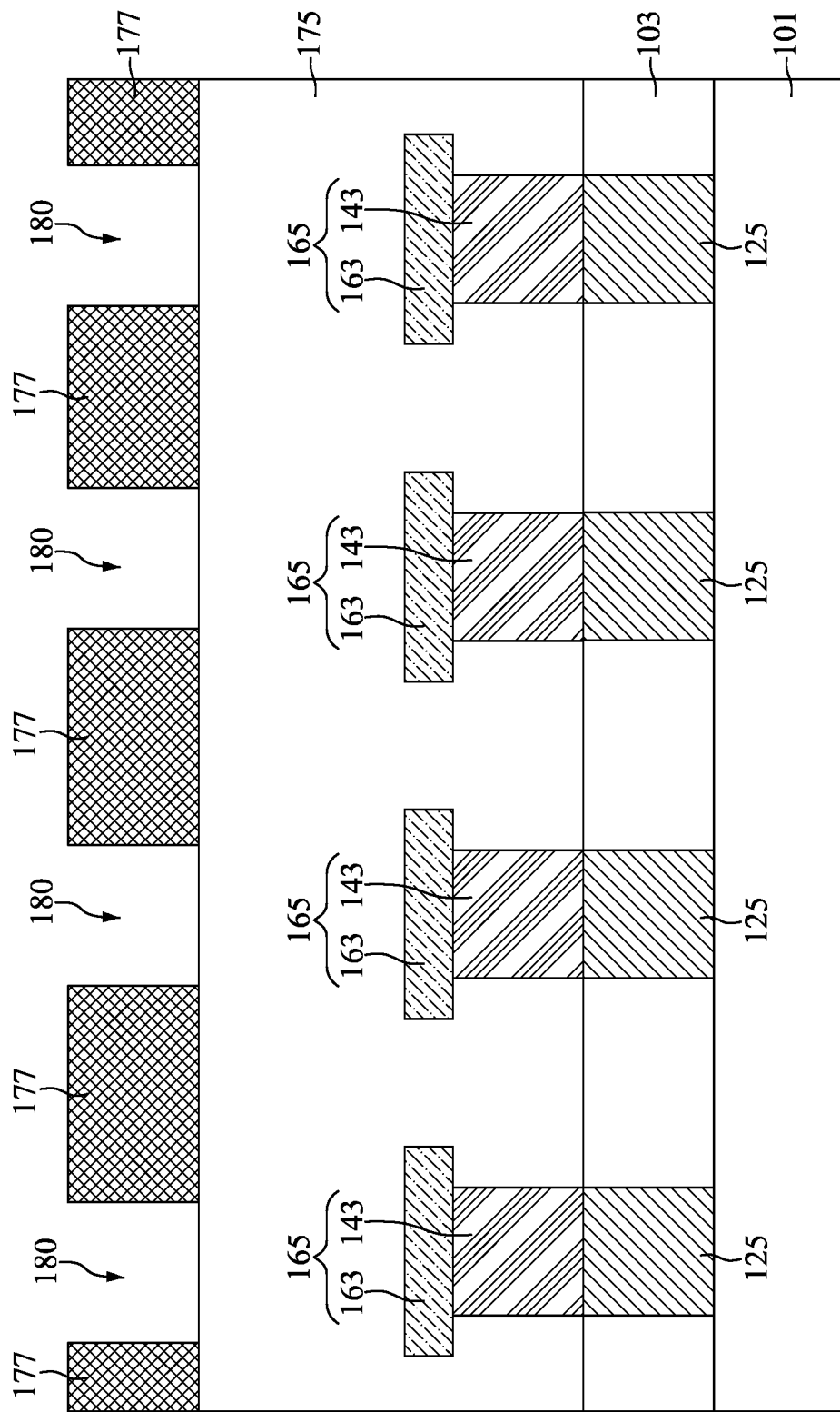
FIG. 17 is a cross-sectional view illustrating an intermediate stage of forming a patterned mask over the third dielectric layer during the formation of the semiconductor device, in accordance with some embodiments.

Subsequently, a patterned mask 177 with a plurality of openings 180 is formed over the dielectric layer 175, as shown in FIG. 17 in accordance with some embodiments. In some embodiments, the patterned mask 177 and the dielectric layer 175 include different materials so that the etching selectivities may be different in the subsequent etching process.

Figure 18:
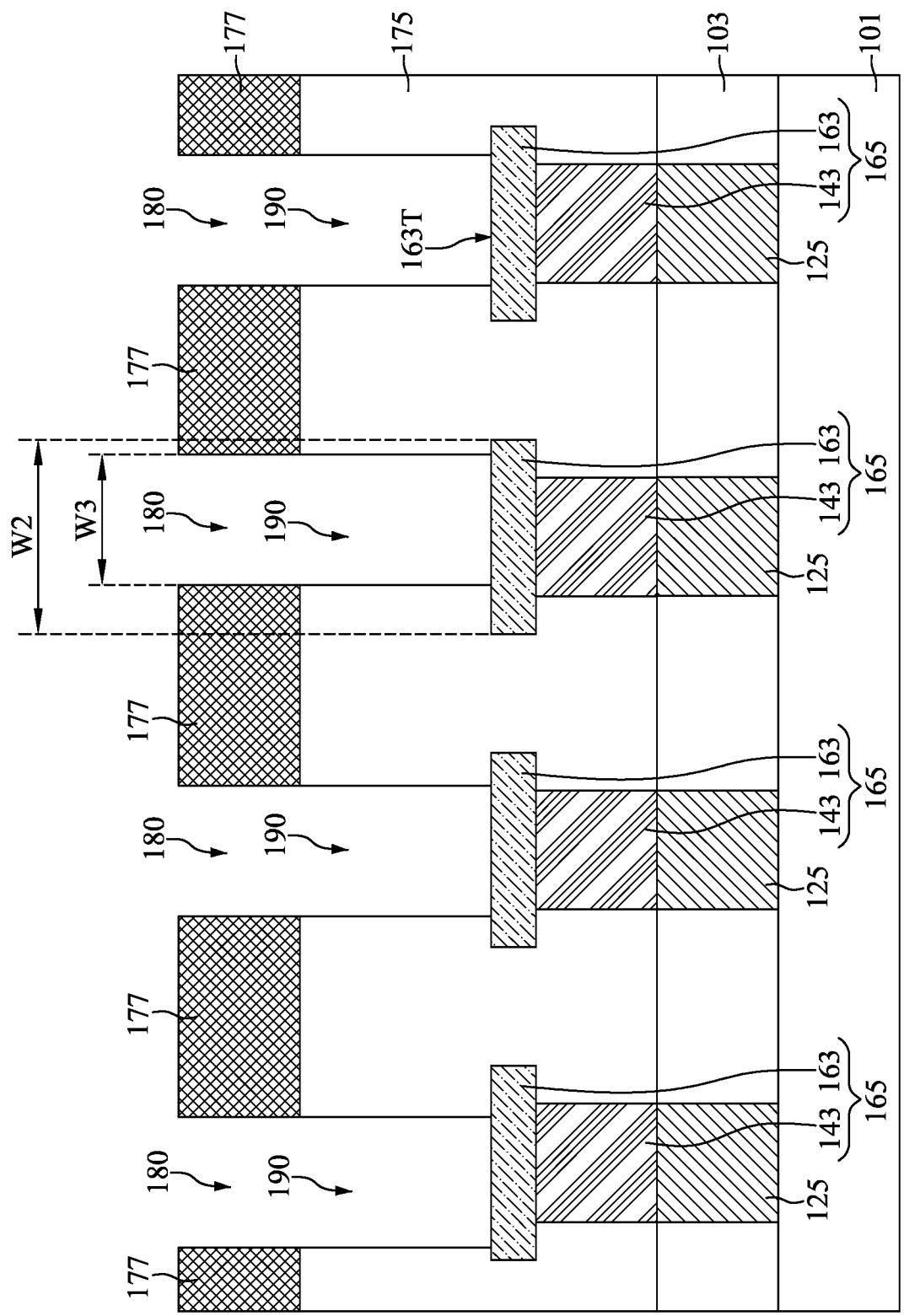
FIG. 18 is a cross-sectional view illustrating an intermediate stage of etching the third dielectric layer to form openings exposing top surfaces of the upper landing pads during the formation of the semiconductor device, in accordance with some embodiments.

Then, an etching process is performed on the dielectric layer 175 using the patterned mask 177 as a mask, such that the top surfaces 163T of the upper landing pads 163 are exposed by a plurality of openings 190, as shown in FIG. 18 in accordance with some embodiments. In some embodiments, each of the openings 190 has a width 3, each of the upper landing pads 163 has a width W2, and the width W2 is greater than the width W1. The etching process may be a wet etching process, a dry etching process, or a combination thereof. After the openings 190 are formed, the patterned mask 177 may be removed.

Next, a plurality of capacitors 197 are formed in the openings 190 over the upper landing pads 163, as shown in FIG. 1 in accordance with some embodiments. The respective step is illustrated as the step S27 in the method 10 shown in FIG. 3. In some embodiments, the capacitors 197 are metal-insulator-metal (MIM) capacitors. As mentioned above, each of the capacitors 197 includes a bottom electrode 191, a top electrode 195, and a dielectric layer 193 sandwiched between the bottom electrode 191 and the top electrode 195.

The formation of the capacitors 197 may include sequentially depositing a conductive material, a dielectric material and another conductive material in the openings 190 (see FIG. 18) and extending over the dielectric layer 175, and performing a planarization process (e.g., a CMP process) to remove excess portions of the two conductive materials and the dielectric material. In some embodiments, the bottom electrodes 191 include titanium nitride (TiN), the dielectric layers 193 includes a dielectric material, such as silicon dioxide ($SiO_2$), hafnium dioxide ($HfO_2$), aluminum oxide ($Al_2O_3$), zirconium dioxide ($ZrO_2$), or a combination thereof, and the top electrodes 195 include titanium nitride (TiN), low-stress silicon-germanium (SiGe), or a combination thereof.

In some embodiments, the capacitors 197 are electrically connected to the source/drain regions (not shown) in the semiconductor substrate 101 through the landing pad structures 165 and the conductive contacts 125. After the capacitors 197 are formed, the semiconductor device 100 is obtained. In some embodiments, the semiconductor device 100 is part of a DRAM. In some embodiments, the widths W2 of the upper landing pads 163 of the landing pad structures 165 are greater than the widths W3 of the capacitors 197, thereby creating a larger landing area for the capacitors 197. In addition, in some embodiments, the top surfaces 163T and the bottom surfaces 163B of the upper landing pads 163 are in direct contact with the dielectric layer 175.

As shown in FIG. 1, since the landing pad structures 165 have T-shaped cross-sections, the landing area for the capacitors 197 to land on is increased. Moreover, the contact resistance between the landing pad structures 165 and the capacitors 197 is reduced, and the risk of misalignment can be prevented or reduced. As a result, the overall device performance may be improved, and the yield rate of the semiconductor device 100 may be increased.

Figure 19:
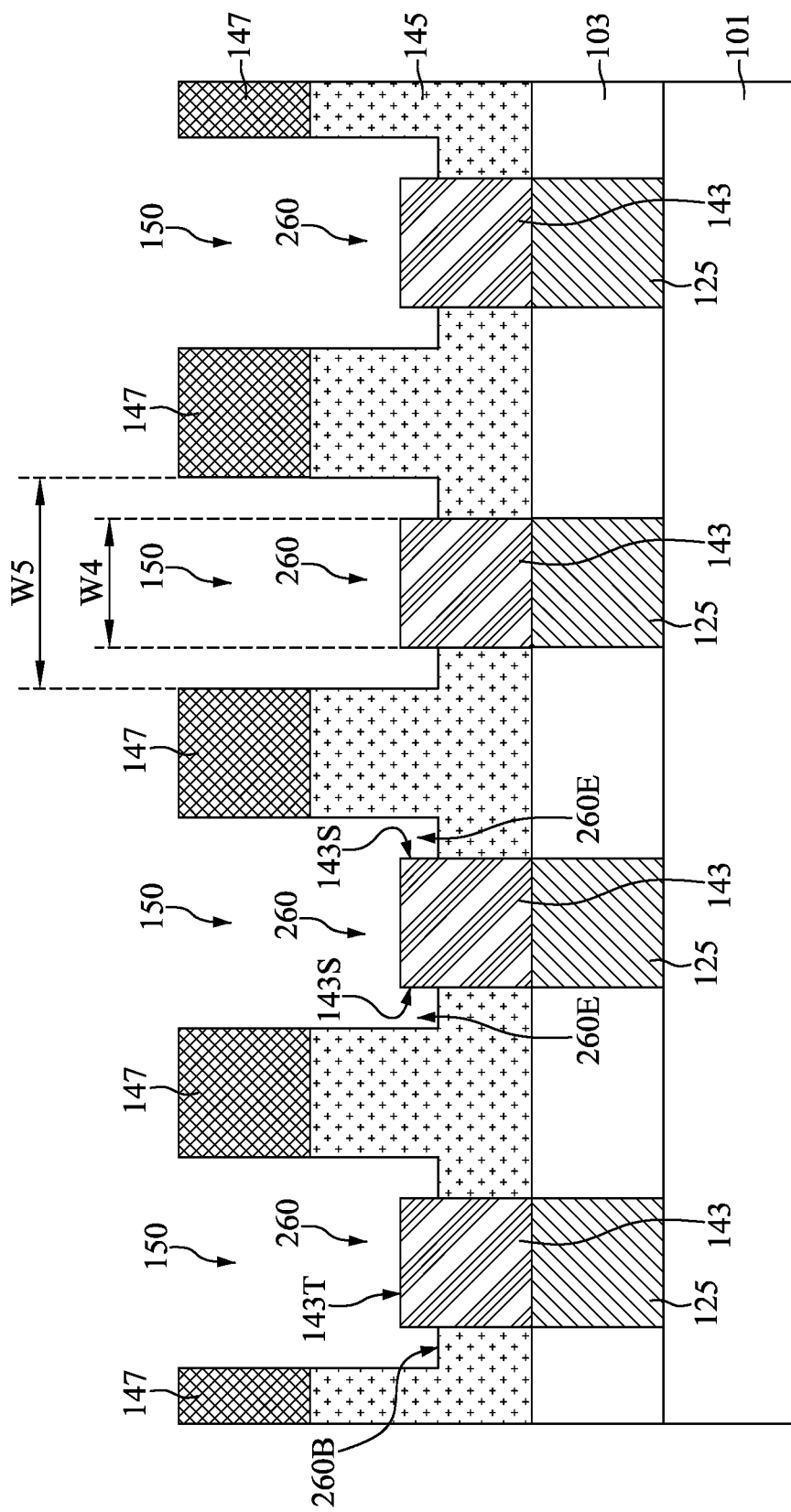
FIG. 19 is a cross-sectional view illustrating an intermediate stage of etching the second dielectric layer to form openings exposing upper sidewalls and top surfaces of the lower landing pads during the formation of the semiconductor device, in accordance with some embodiments.
Figure 20:
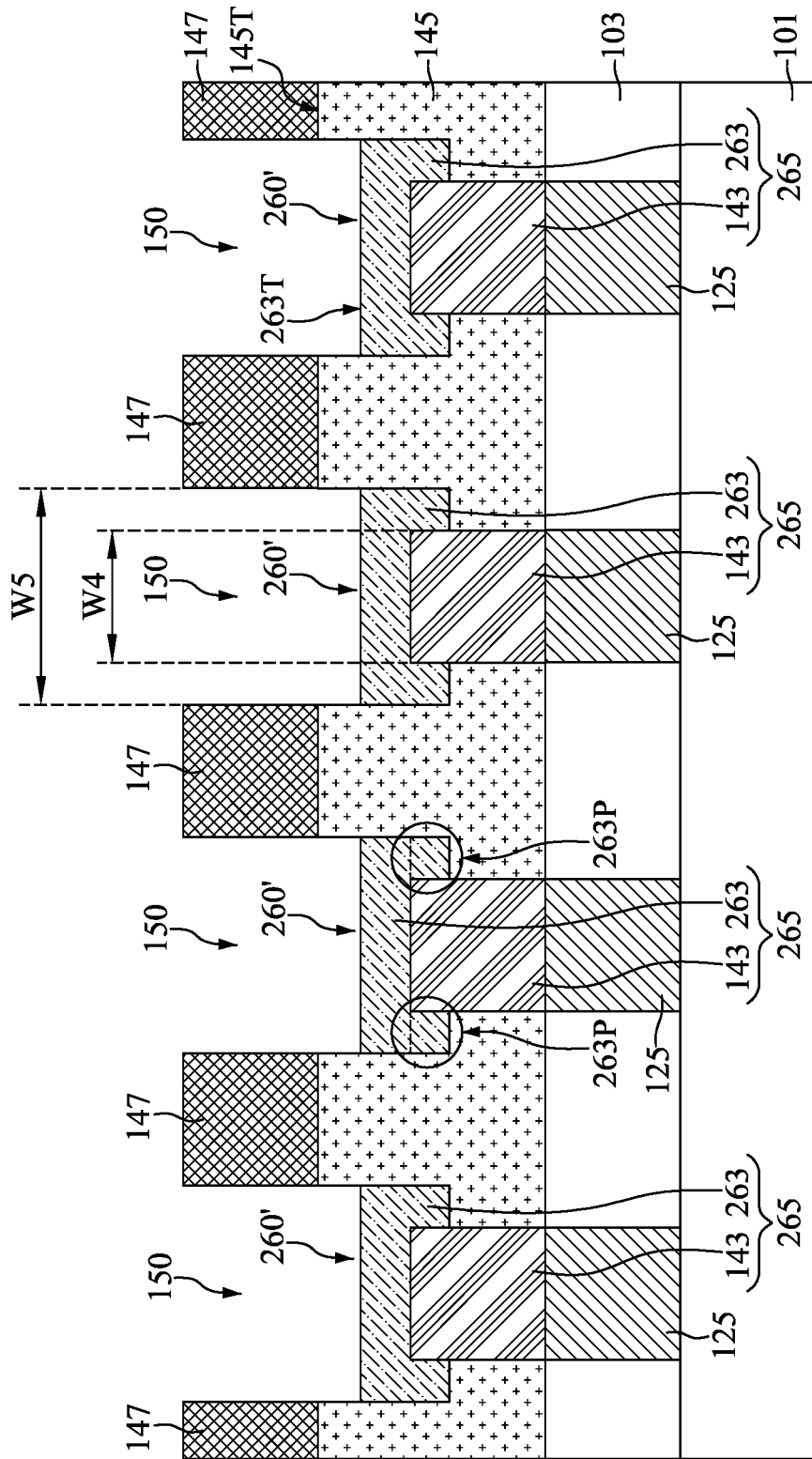
FIG. 20 is a cross-sectional view illustrating an intermediate stage of forming upper landing pads with protruding portions covering the upper sidewalls of the lower landing pads during the formation of the semiconductor device, in accordance with some embodiments.
Figure 21:
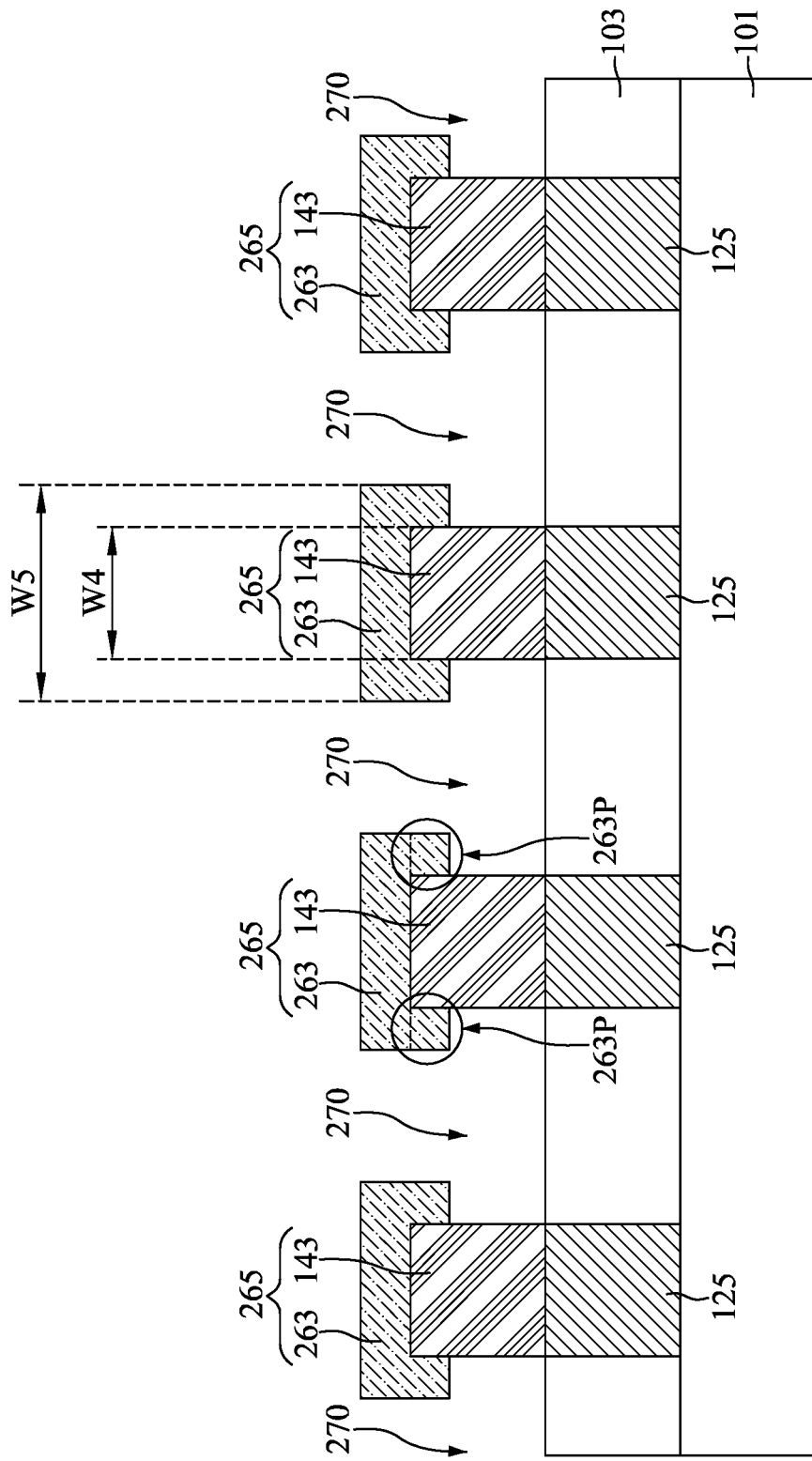
FIG. 21 is a cross-sectional view illustrating an intermediate stage of removing the patterned mask and the second dielectric layer during the formation of the semiconductor device, in accordance with some embodiments.

FIGS. 19-21 are cross-sectional views illustrating intermediate stages in the formation of the semiconductor device 200, in accordance with some embodiments. It should be pointed out that operations for forming the semiconductor device 200 before the structure shown in FIG. 19 are substantially the same as the operations for forming the semiconductor device 100 shown in FIGS. 4-11, and the related detailed descriptions may refer to the foregoing paragraphs and are not discussed again herein.

After the patterned mask 147 with the openings 150 are formed over the dielectric layer 145, an etching process is performed on the dielectric layer 145 using the patterned mask 147 as a mask, such that the top surfaces 143T and the upper sidewalls 143S of the lower landing pads 143 are exposed by a plurality of openings 260, as shown in FIG. 19 in accordance with some embodiments. The respective step is illustrated as the step S19 in the method 10 shown in FIG. 3. The etching process may be a wet etching process, a dry etching process, or a combination thereof.

In some embodiments, the openings 260 have extending portions 260E exposing the opposite upper sidewalls 143S of the lower landing pads 143. Moreover, in some embodiments, the bottom surfaces 260B (i.e., the bottommost surfaces) of the openings 260 are lower than the top surface 143T of the lower landing pads 143. Furthermore, in some embodiments, each of the lower landing pads 143 has a width W4, each of the openings 260 has a width W5, and the width W5 is greater than the width W4.

Subsequently, a plurality of upper landing pads 263 are formed in the openings 260, as shown in FIG. 20 in accordance with some embodiments. The respective step is illustrated as the step S21 in the method 10 shown in FIG. 3. In some embodiments, the openings 260 are not fully filled with the upper landing pads 263. In other words, the openings 260 partially filled with the upper landing pads 263 become remaining openings 260'. In some embodiments, the top surfaces 263T of the upper landing pads 263 are lower than the top surface 145T of the dielectric layer 145.

Moreover, the extending portions 260E of the opening 260 as shown in FIG. 19 are filled by portions of the upper landing pads 263 (also referred to as protruding portions 263P of the upper landing pads 263), in accordance with some embodiments. In addition, each of the upper landing pads 263 has a width substantially the same as the width W5 of the openings 260 shown in FIG. 19. As mentioned above, the width W5 of the upper landing pads 263 is greater than the width W4 of the lower landing pads 143. In some embodiments, the upper landing pads 263 and the lower landing pads 143 include the same material, such as tungsten (W). Some materials and processes used to form the upper landing pads 263 are similar to, or the same as those used to form the upper landing pads 163 in the semiconductor device 100, and details thereof are not repeated herein. After the upper landing pads 263 are formed, the landing pads structures 265 with T-shaped cross-sections are obtained.

Then, the patterned mask 147 and the dielectric layer 145 are removed, as shown in FIG. 21 in accordance with some embodiments. The respective step is illustrated as the step S23 in the method 10 shown in FIG. 3. In some embodiments, the patterned mask 147 is removed by a stripping process, an ashing process, an etching process, or another suitable process, and the dielectric layer 145 is removed by an etching process, such as a wet etching process. After the removal of the patterned mask 147 and the dielectric layer 145, any two adjacent ones of the landing pad structures 265 are separated by an opening 270, in accordance with some embodiments. As shown in FIG. 21, each of the openings 270 has an inverted T-shape.

Next, a dielectric layer 275 is formed covering the landing pad structure 265 (including the lower landing pads 143 and the upper landing pads 263) and the dielectric layer 103, an etching process is performed on the dielectric layer 275 to form openings (not shown) exposing the upper landing pads 263, and a plurality of capacitors 297 are formed in the openings over the upper landing pads 163, as shown in FIG. 2 in accordance with some embodiments. The respective steps are illustrated as the steps S25 and S27 in the method 10 shown in FIG. 3. Some materials and processes used to form the dielectric layer 275 and the openings exposing the upper landing pads 263 are similar to, or the same as those used to form the dielectric layer 175 and the openings 190 of the semiconductor device 100 (see FIGS. 16-18), and details thereof are not repeated herein.

In some embodiments, the capacitors 297 are MIM capacitors. As mentioned above, each of the capacitors 297 includes a bottom electrode 291, a top electrode 295, and a dielectric layer 293 sandwiched between the bottom electrode 291 and the top electrode 295. Some materials and processes used to form the bottom electrodes 291, the dielectric layers 293 and the top electrode 295 are similar to, or the same as those used to form the bottom electrodes 191, the dielectric layers 193 and the top electrode 195 of the semiconductor device 100, and details thereof are not repeated herein.

In some embodiments, the capacitors 297 are electrically connected to the source/drain regions (not shown) in the semiconductor substrate 101 through the landing pad structures 265 and the conductive contacts 125. After the capacitors 297 are formed, the semiconductor device 200 is obtained. In some embodiments, the semiconductor device 200 is part of a DRAM. In some embodiments, the widths W5 of the upper landing pads 263 of the landing pad structures 265 are greater than the widths W6 of the capacitors 297, thereby creating a larger landing area for the capacitors 297. In addition, in some embodiments, the top surfaces 263T and the bottom surfaces 263B of the upper landing pads 263 are in direct contact with the dielectric layer 275.

As shown in FIG. 2, since the landing pad structures 265 have T-shaped cross-sections, the landing area for the capacitors 297 to land on is increased. Moreover, the contact resistance between the landing pad structures 265 and the capacitors 297 is reduced, and the risk of misalignment can be prevented or reduced. As a result, the overall device performance may be improved, and the yield rate of the semiconductor device 200 may be increased.

Embodiments of a semiconductor device and method for preparing the same are provided in the disclosure. In some embodiments, the semiconductor device includes a T-shaped landing pad structure disposed over a conductive contact. Each of the T-shaped landing pad structures includes a lower landing pad and an upper landing pad, and a width of the upper landing pad is greater than a width of the lower landing pad. The T-shaped landing pad structure can help to increase landing area for an overlying conductive feature, such as a capacitor, to land on. Therefore, the contact resistance may be reduced, and the risk of misalignment between the landing pad structure and the overlying conductive feature may be prevented or reduced. As a result, the overall device performance may be improved, and the yield rate of the semiconductor device may be increased.

In one embodiment of the present disclosure, a semiconductor device is provided. The semiconductor device includes a first dielectric layer disposed over a semiconductor substrate, and a conductive contact penetrating through the first dielectric layer. The semiconductor device also includes a T-shaped landing pad structure disposed over and in direct contact with the conductive contact. The T-shaped landing pad structure includes a lower landing pad and an upper landing pad disposed over the lower landing pad, and a width of the upper landing pad is greater than a width of the lower landing pad. The semiconductor device further includes a capacitor disposed over and in direct contact with the T-shaped landing pad structure, and a second dielectric layer disposed over the first dielectric layer and surrounding the T-shaped landing pad structure and the capacitor.

In another embodiment of the present disclosure, a method for preparing a semiconductor device is provided. The method includes forming a first dielectric layer over a semiconductor substrate, and forming a conductive contact penetrating through the first dielectric layer. The method also includes forming a lower landing pad over the conductive contact, and forming a second dielectric layer covering the lower landing pad. The method further includes etching the second dielectric layer to form a first opening exposing the lower landing pad, and forming an upper landing pad in the first opening. The lower landing pad and the upper landing pad form a T-shaped landing pad structure.

In yet another embodiment of the present disclosure, a method for preparing a semiconductor device is provided. The method includes forming a first dielectric layer over a semiconductor substrate, and forming a conductive contact penetrating through the first dielectric layer. The method also includes forming a lower landing pad over the conductive contact, and forming a second dielectric layer covering the lower landing pad. The method further includes etching the second dielectric layer to form a first opening exposing a top surface of the lower landing pad, and forming an upper landing pad in the first opening. A width of the upper landing pad is greater than a width of the lower landing pad. In addition, the method includes forming a capacitor over the upper landing pad. The width of the upper landing pad is greater than a width of the capacitor.

The embodiments of the present disclosure have some advantageous features. In some embodiments, the semiconductor device includes a T-shaped landing pad structure having a lower landing pad and an upper landing pad, and a width of the upper landing pad is greater than a width of the lower landing pad. The T-shaped landing pad structure can help to increase landing area for an overlying conductive feature, such as a capacitor, to land on. Therefore, the contact resistance may be reduced, and the risk of misalignment between the landing pad structure and the overlying conductive feature may be prevented or reduced. As a result, the performance, reliability and yield of the semiconductor device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
    forming a first dielectric layer over a semiconductor substrate;
    forming a conductive contact penetrating through the first dielectric layer; forming a lower landing pad over the conductive contact;
    forming a second dielectric layer covering the lower landing pad;
    etching the second dielectric layer to form a first opening exposing the lower landing pad; and
    forming an upper landing pad in the first opening, wherein the lower landing pad and the upper landing pad form a T-shaped landing pad structure and
    forming a third dielectric layer covering the T-shaped landing pad structure;
    etching the third dielectric layer to form a second opening partially exposing the upper landing pad of the T-shaped landing pad structure; and
    forming a capacitor in the second opening, wherein the capacitor is electrically connected to the conductive contact through the T-shaped landing pad structure.

2. The method for preparing a semiconductor device of claim 1, wherein a width of the first opening is greater than a width of the lower landing pad.

3. The method for preparing a semiconductor device of claim 1, wherein a top surface of the second dielectric layer is higher than a top surface of the upper landing pad after the T-shaped landing pad structure is formed.

4. The method for preparing a semiconductor device of claim 1, wherein the second dielectric layer is removed after the T-shaped landing pad structure is formed.

5. The method for preparing a semiconductor device of claim 1, wherein the first opening includes an extending portion extending into the second dielectric layer to partially expose a sidewall of the lower landing pad.

6. The method for preparing a semiconductor device of claim 5, wherein the forming of the upper landing pad includes filling the extending portion of the first opening with a portion of the upper landing pad.

7. A method for preparing a semiconductor device, comprising:
    forming a first dielectric layer over a semiconductor substrate;
    forming a conductive contact penetrating through the first dielectric layer;
    forming a lower landing pad over the conductive contact;
    forming a second dielectric layer covering the lower landing pad;
    etching the second dielectric layer to form a first opening exposing atop surface of the lower landing pad, wherein the first opening includes an extending portion extending into the second dielectric layer to partially expose a sidewall of the lower landing pad,
    forming an upper landing pad in the first opening, wherein a width of the upper landing pad is greater than a width of the lower landing pad; and
    forming a capacitor over the upper landing pad, wherein the width of the upper landing pad is greater than a width of the capacitor.

8. The method for preparing a semiconductor device of claim 7, wherein a width of the first opening is greater than the width of the lower landing pad.

9. The method for preparing a semiconductor device of claim 7, further comprising:
    forming a patterned mask over the second dielectric layer; and
    etching the second dielectric layer using the patterned mask as a mask to form the first opening.

10. The method for preparing a semiconductor device of claim 9, further comprising:
    removing the patterned mask and the second dielectric layer after the upper landing pad is formed; and
    forming a third dielectric layer covering the upper landing pad before the capacitor is formed.

11. The method for preparing a semiconductor device of claim 7, wherein a material of the lower landing pad is the same as a material of the upper landing pad.

12. The method for preparing a semiconductor device of claim 7, wherein a top surface of the lower landing pad is higher than a bottom surface of the first opening before the upper landing pad is formed.

\* \* \* \* \*